(12) United States Patent
Malshe et al.

(10) Patent No.: US 9,477,549 B2
(45) Date of Patent: Oct. 25, 2016

(54) METHODS, SYSTEMS, AND COMPUTER READABLE MEDIA FOR ADDRESS AND DATA INTEGRITY CHECKING IN FLASH MEMORY OPERATIONS

(71) Applicant: SanDisk Technologies Inc., Plano, TX (US)

(72) Inventors: Ashutosh Malshe, Fremont, CA (US); Karthik Krishnamoorthy, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 103 days.

(21) Appl. No.: 14/486,704

(22) Filed: Sep. 15, 2014

(65) Prior Publication Data

US 2016/0077911 A1    Mar. 17, 2016

(51) Int. Cl.
| | |
|---|---|
| G11C 29/00 | (2006.01) |
| G06F 11/10 | (2006.01) |
| G11C 29/52 | (2006.01) |
| G11C 8/20 | (2006.01) |
| G11C 16/08 | (2006.01) |
| G11C 29/04 | (2006.01) |

(52) U.S. Cl.
CPC ............ *G06F 11/1068* (2013.01); *G11C 8/20* (2013.01); *G11C 16/08* (2013.01); *G11C 29/52* (2013.01); *G11C 2029/0411* (2013.01)

(58) Field of Classification Search
None
See application file for complete search history.

(56) References Cited

U.S. PATENT DOCUMENTS

| | | | | |
|---|---|---|---|---|
| 5,768,294 | A | * | 6/1998 | Chen .................. G06F 11/1016 704/229 |
| 5,987,585 | A | * | 11/1999 | Motoyama .......... G06F 12/0893 711/E12.041 |
| 7,102,544 | B1 | | 9/2006 | Liu |
| 8,443,263 | B2 | * | 5/2013 | Selinger .............. G06F 11/1068 714/768 |
| 8,464,135 | B2 | | 6/2013 | Erez et al. |
| 2002/0073359 | A1 | * | 6/2002 | Wade .................. G06F 11/0721 714/37 |
| 2007/0033512 | A1 | * | 2/2007 | Johnson .................. G06F 11/10 714/801 |
| 2011/0055671 | A1 | | 3/2011 | Kim et al. |
| 2012/0166909 | A1 | | 6/2012 | Schmisseur et al. |
| 2012/0185752 | A1 | * | 7/2012 | Maheshwari ....... G06F 11/1016 714/768 |
| 2014/0082264 | A1 | | 3/2014 | Wan et al. |

FOREIGN PATENT DOCUMENTS

| | | |
|---|---|---|
| CN | 103365815 A | 10/2013 |
| FR | 2 933 791 A1 | 1/2010 |

\* cited by examiner

*Primary Examiner* — Daniel McMahon
(74) *Attorney, Agent, or Firm* — Jenkins, Wilson, Taylor & Hunt, P.A.

(57) ABSTRACT

Methods, systems, and computer readable media for address and data integrity checking in flash memory operations are disclosed. One method includes, at a storage controller, generating, for an address unit, an address parity unit. The method further includes generating a command sequence including the address unit, the address parity unit, and an operation command specifying an operation to be performed on a flash memory array. The method further includes providing the command sequence to a flash memory device that includes the non-volatile memory array. The method further includes performing, by the flash memory device, an address integrity check on the address unit using the address parity unit. The method further includes determining whether or not to perform an operation specified by the command sequence based at least in part on a result of the address integrity check.

35 Claims, 5 Drawing Sheets

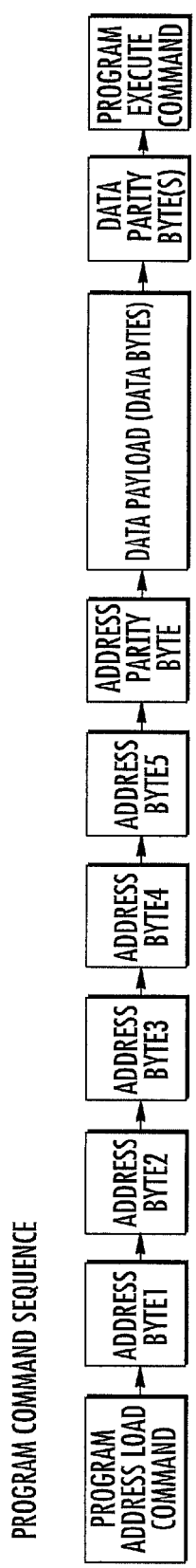
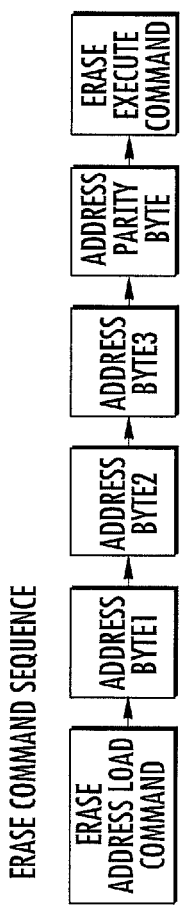
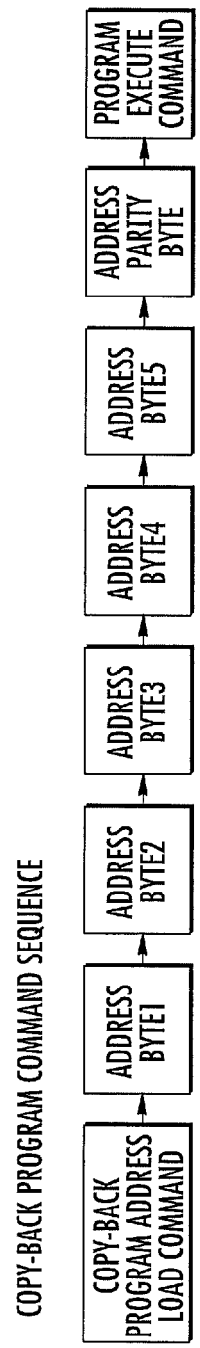
FIG. 4A — PROGRAM COMMAND SEQUENCE
FIG. 4B — ERASE COMMAND SEQUENCE
FIG. 4C — COPY-BACK PROGRAM COMMAND SEQUENCE

METHODS, SYSTEMS, AND COMPUTER READABLE MEDIA FOR ADDRESS AND DATA INTEGRITY CHECKING IN FLASH MEMORY OPERATIONS

TECHNICAL FIELD

The subject matter described herein relates to data and address integrity in flash memory operations. More particularly, the subject matter described herein relates to methods, systems, and computer readable media for address and data integrity checking in flash memory operations.

BACKGROUND

Data integrity checking in flash memory operations has the goal of ensuring sure that the correct data is written to a flash memory device. For example, a controller typically performs a single integrity check on data to be written to a flash memory device prior to writing the data to the flash memory device. Such integrity checking is performed by computing and adding data parity bytes to data bytes to be written to the flash memory device and checking the parity before providing the data bytes to the flash memory device as part of a command sequence. If the data integrity checks passes, the command sequence is transmitted over a bus to the flash memory device. Depending on the nature of a data integrity failure, the command sequence may be re-created, and the data integrity check is re-attempted. Once the data integrity check is successful on the controller side, no further integrity checking is performed, and the data is transmitted over the bus and written to the flash memory array.

Transmission errors, i.e., errors that occur after the data parity check by the controller during transmission of data from the controller to the flash memory device, can cause errors in data written to flash memory. Such errors may be caused by board level disturbances or other disturbances that affect signal integrity. If the data becomes corrupted during transmission to the flash memory device, after the controller side data parity check, the incorrect data will be written to the flash memory array, and the error will not be discovered until the data is read back from the array. Writing incorrect data to the flash memory array not only wastes memory bandwidth and inefficiently uses storage resources, but may also reduce the correction capability of the error correction control (ECC) engine, which is the controller component that performs data parity checking, and increase power consumption.

The absence of error checking for address bytes can cause operations to be performed on incorrect address ranges. For NAND flash memory, the memory command and address cycles use conventional speed, for example, up to 50 MHz, which is much slower than the memory data transfer, for example, 200 MHz for Toggle Mode 400 and hence the likelihood of address integrity errors is low. However, as higher speed memories are used, higher speeds for command and address cycles may be used to further reduce latency. This may increase the susceptibility of address bytes to become corrupted due to transmission errors. If address bytes become corrupted, data can be written to the wrong address in program operations. In erase operations, if the address bytes are corrupted, the wrong block of memory will be erased. Data and address errors become even more likely in hierarchical memory systems where there are multiple controllers and bus interfaces between hosts and non-volatile memory cells.

Accordingly, there exists a need for methods, systems, and computer readable media for address and data integrity checking in flash memory operations.

SUMMARY

Methods, systems, and computer readable media for address and data integrity checking in flash memory operations are disclosed. One method includes, at a controller, generating, for an address unit, an address parity unit. The method further includes generating a command sequence including the address unit, the address parity unit and an operational command specifying an operation to be performed on a flash memory array. The method further includes providing the command sequence to a flash memory device that includes the flash memory array. The method further includes performing, by the flash memory device, an address integrity check on the address unit using the address parity unit. The method further includes determining whether or not to perform an operation specified by the command sequence based at least in part on a result of the address integrity check.

Although the address and data integrity checking is described in the examples below as computing at least one address parity byte or at least one data parity byte for at least one address byte or at least one data byte, respectively, the subject matter described herein is not limited to computing address parity or data parity on byte boundaries or where the result of the parity calculation is a byte. Computing address or data parity on any number of address or data bits to be provided to the flash memory device is intended to be within the scope of the subject matter described herein. For example, parity could be computed for units of address or data bits that are larger or smaller than bytes. In addition, the bit length of the result of the parity calculation could range from a single bit to any number of bits (larger or smaller than a byte) depending on the parity calculation algorithm used. Thus, in the claims, the terms "address parity unit", "data parity unit", "address unit", and "data unit" are used, where a unit can be any number of bits.

The subject matter described herein can be implemented in software in combination with hardware and/or firmware. For example, the subject matter described herein can be implemented in software executed by a processor. In one exemplary implementation, the subject matter described herein can be implemented using a non-transitory computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Embodiments of the subject matter described herein will now be explained with reference to the accompanying drawings, wherein like reference numerals represent like parts, of which:

FIG. 4A is a block diagram illustrating a program command sequence with address and data parity bytes according to an embodiment of the subject matter described herein;

FIG. 4B is an erase command sequence with address parity bytes checking according to an embodiment of the subject matter described herein; and FIG. 4C is a block diagram illustrating a copy-back program command sequence with address parity bytes usable for address parity checking by a non-volatile memory device according to an embodiment of the subject matter described herein.

DETAILED DESCRIPTION

Methods, systems, and computer readable media for address and data integrity checking in flash memory operations are disclosed. Rather than only performing a data integrity check by the controller prior to writing a command sequence to the flash memory device, the flash memory device described herein performs address and data integrity checks by the flash memory device after the address and data bytes and corresponding parity bytes are transmitted from the controller to the flash memory device, thus reducing the likelihood that transmission and other signal errors will cause incorrect operations to be performed on the memory array.

A flash memory device described herein include data and address parity checkers that are implemented as peripheral circuitry of the flash memory device. The peripheral circuitry may be on the same chip or die as the flash memory array or on a separate chip or die from the flash memory array. The flash memory device may be logically and physically separate from its controller, the separation being provided by a bus or other electrical interface between the flash memory device and the controller. The flash memory device may be located on the same chip or die as the controller or on a separate chip or die from the controller.

The examples described below relate primarily to NAND flash memory. However, the subject matter described herein is not limited to use with NAND flash memory. The subject matter described herein can be used with any type of flash memory for which address parity and additional data parity checking would be beneficial, including, for example, NOR flash memory.

Figure 1A:
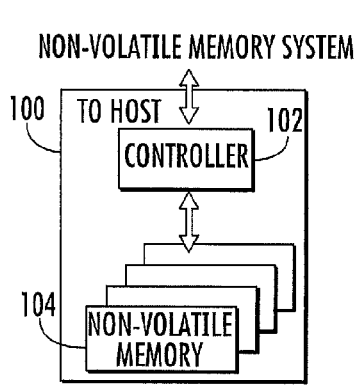
FIG. 1A is a block diagram of a non-volatile memory system with address and data integrity checking according to an embodiment of the subject matter described herein.

FIG. 1A is a block diagram illustrating a non-volatile memory system according to an embodiment of the subject matter described herein. Referring to FIG. 1A, non-volatile memory system 100 includes a controller 102 and a non-volatile memory device 104. Controller 102 interfaces with a host system and transmits command sequences for read, program, and erase operations to non-volatile memory device 104. As will be described in more detail below, controller 102 may add address and data parity bytes to command sequences provided to non-volatile memory device 104, and non-volatile memory device 104 may include one or more peripheral circuits that verify the integrity of the address and data bytes included in the command sequences using the address and data parity bytes. Non-volatile memory device 104 may include any suitable non-volatile storage medium, including NAND flash memory cells and/or NOR flash memory cells. The interface between controller 102 and non-volatile memory device 104 may be any suitable flash interface, such as Toggle Mode 200, 400, or 800. In one embodiment, system 100 may be a card based system, such as a secure digital (SD) or a micro secure digital (micro-SD) card. In an alternate embodiment, system 100 may be part of an embedded memory system.

Although in the example illustrated in FIG. 1A, non-volatile memory system 100 includes a single channel between controller 102 and non-volatile memory device 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory device, even if a single channel is shown in the drawings.

Figure 1B:
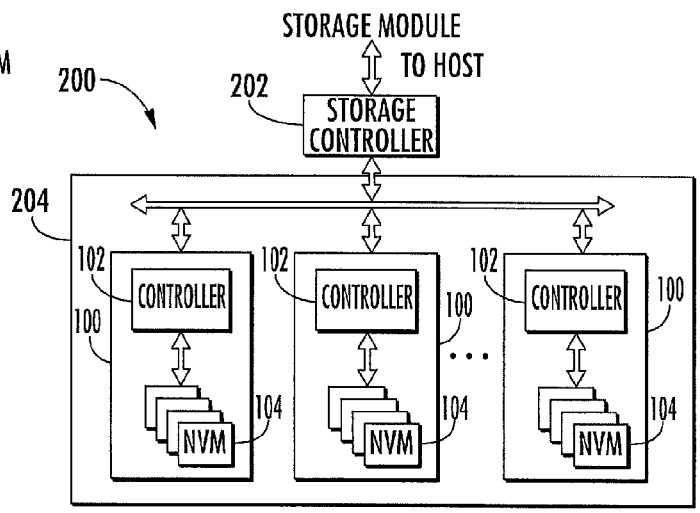
FIG. 1B is a block diagram illustrating an exemplary storage module with address and data integrity checking according to an embodiment of the subject matter described herein.

FIG. 1B illustrates a storage module 200 that includes plural non-volatile memory systems 100. As such, storage module 200 may include a storage controller 202 that interfaces with a host and with memory system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Each non-volatile memory system 100 may perform the operations described herein for address and data integrity checking prior to writing data to or erasing memory cells of non-volatile memory device 104. Storage system 200 illustrated in FIG. 1B, in one embodiment, may be a solid state drive (SSD), such as found in portable computing devices, such as laptop computers, tablet computers, and mobile phones.

Figure 1C:
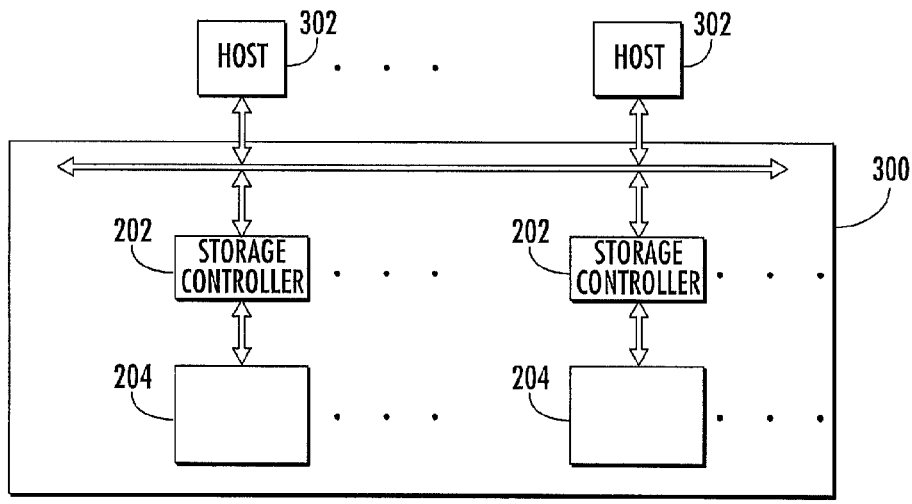
FIG. 1C is a block diagram illustrating a hierarchical storage system with address and data integrity checking according to an embodiment of the subject matter described herein.

FIG. 1C is a block diagram illustrating a hierarchical storage system with address and data integrity checking according to an embodiment of the subject matter described herein. Referring to FIG. 1C, a hierarchical storage system 300 includes a plurality of storage controllers 202, each of which control a respective memory system 204. Host systems 302 may access memories within the storage system via a bus interface. In one embodiment, the bus interface may be a serial attached SCSI (SAS) or fiber channel over Ethernet (FCoE) interface. In the system illustrated in FIG. 1C, address and data integrity checking may be performed within memory subsystems 204. In one embodiment, the system illustrated in FIG. 1C may be a rack mountable mass storage system that is accessible by multiple host computers, such as would be found in a data center or other location where mass storage is needed.

Figure 2A:
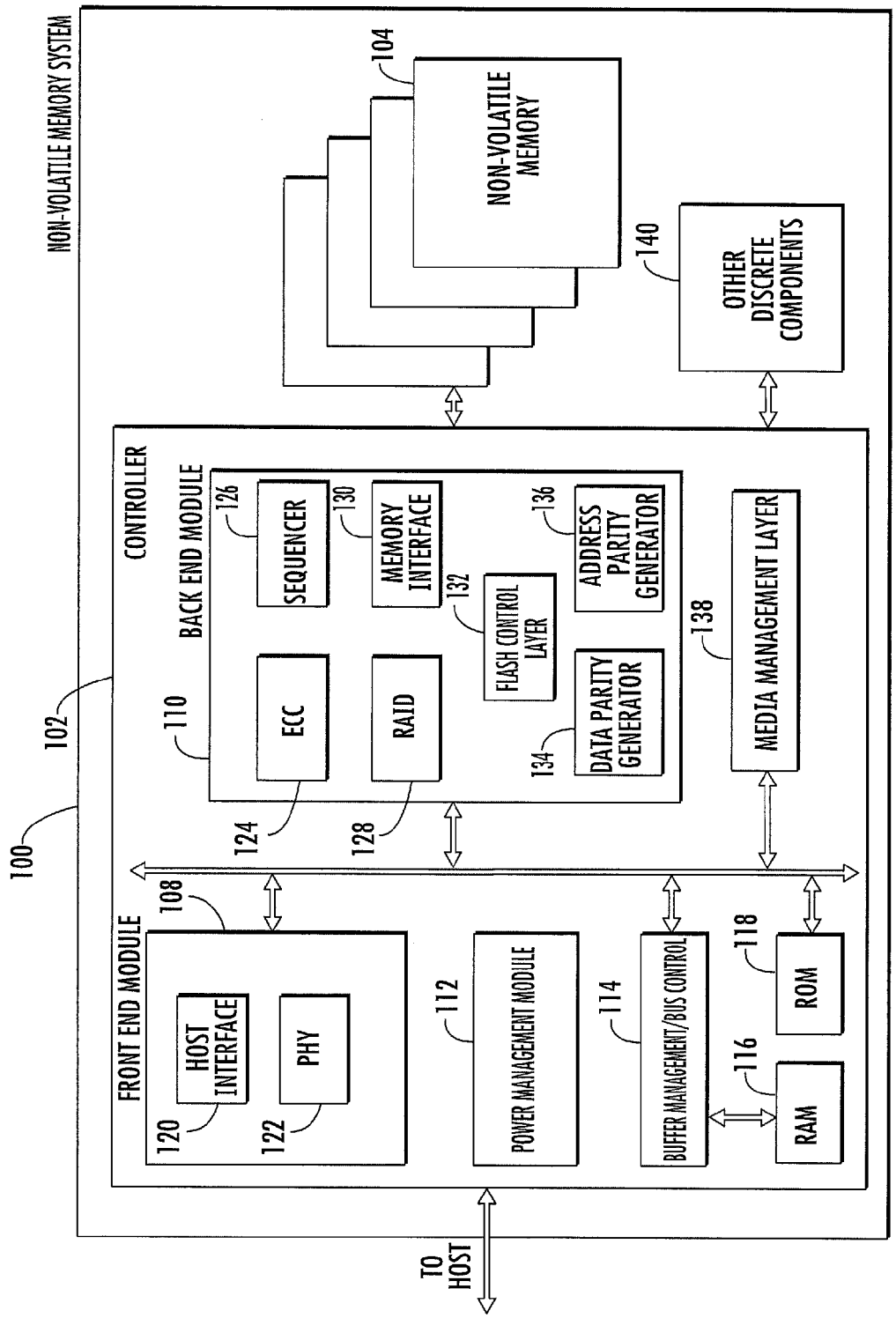
FIG. 2A is a block diagram illustrating exemplary components of the controller of the non-volatile memory system illustrated in FIG. 1A according to an embodiment of the subject matter described herein.

FIG. 2A is a block diagram illustrating exemplary components of controller 102 in more detail. Referring to FIG. 2A, controller 102 includes a front end module 108 that interfaces with a host, a back end module 110 that interfaces with non-volatile memory device 104, and various other modules that perform functions which will now be described in detail. In the illustrated example, these modules include a power management module 112 that performs power management functions for controller 102. A buffer manager/bus controller 114 manages buffers in random access memory (RAM) 116 and controls the internal bus arbitration of controller 102. A read only memory (ROM) 118 stores system boot code. Front end module 108 includes a host interface 120 and a physical layer interface 122 that provide the electrical interface with the host or next level memory controller.

Back end module 110 includes an error correction controller (ECC) engine 124 that performs encoding on the data bytes received from the host and decoding and error correction on the data bytes read from the non-volatile memory. A command sequencer 126 generates command sequences, such as program and erase command sequences, to be transmitted to non-volatile memory device 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory device 104 and receives status information from non-volatile memory device 104. In one embodiment, memory interface 130 may be a dual data rate (DDR) interface, such as a Toggle Mode 200, 400, or 800 interface. A flash control layer 132 controls the overall operation of back end module 110.

According to an embodiment of the subject matter described herein, data parity generator 134 generates parity bytes based on received data bytes from the host using any suitable data parity generation algorithm, such as a cyclic redundancy check (CRC) for exclusive OR (XOR). These parity bytes may be added to command sequences by sequencer 126 and transmitted to non-volatile memory device 104 for detection of errors in data after the data leaves controller 102. An address parity generator 136 generates address parity bytes using any suitable parity generation algorithm, such as CRC or XOR, and provides those parity bytes to sequencer 126, which generates the command sequences including the address parity bytes. The address parity bytes are used by components of non-volatile memory device 104 to verify the integrity of received address bytes and thereby prevent operations on the wrong memory locations of non-volatile memory in non-volatile memory device 104.

Additional components of system 100 illustrated in FIG. 2A include media management layer 138, which performs wear leveling of memory cells of non-volatile memory device 104. System 100 also includes other discrete components 140, such as external electrical interfaces, external RAM, resistors, capacitors, or other components that may interface with controller 102.

Figure 2B:
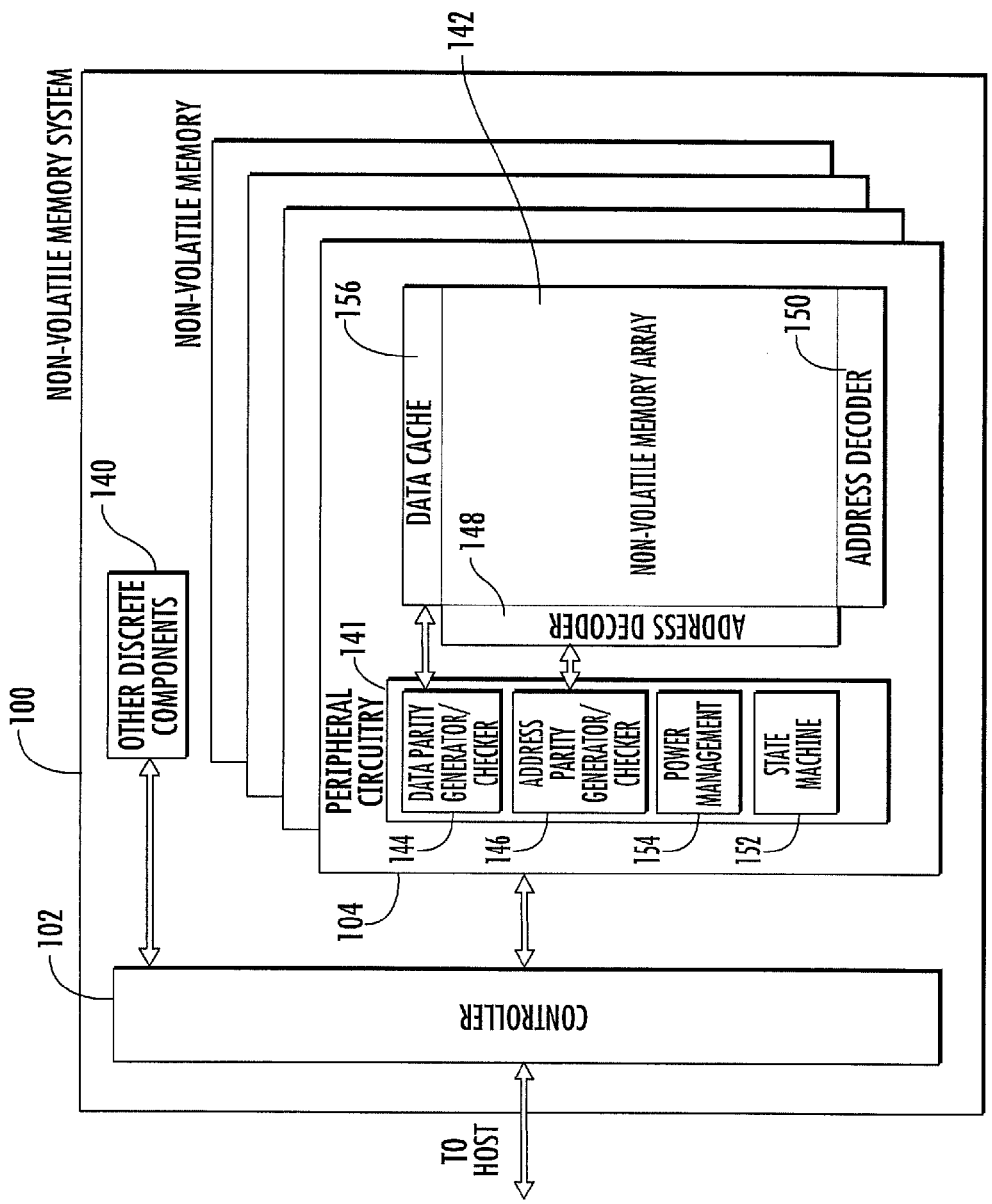
FIG. 2B is a block diagram illustrating exemplary components of the non-volatile memory of the non-volatile memory storage system illustrated in FIG. 1A according to an embodiment of the subject matter described herein.

FIG. 2B is a block diagram illustrating exemplary components of non-volatile memory device 104 in more detail. Referring to FIG. 2B, non-volatile memory device 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes data parity generator/checker 144 that receives data bytes from controller 102, computes parity bytes for the data bytes, and compares the computed parity bytes to the generated parity bytes. If data parity generator/checker 144 detects a mismatch between the data parity bytes and the transmitted data bytes, data parity generator/checker 144 may notify controller 102.

Peripheral circuitry 141 further includes address parity generator/checker 146. Address parity generator/checker 146 computes parity bytes for address bytes received from controller 102, compares the computed parity bytes with the transmitted address parity bytes, and determines whether the computed parity bytes match the transmitted parity bytes. If there is a match, address parity generator/checker 146 may provide the address bytes to address decoders 148 and 150, which decode the column and row of the address so that the operation can be performed on the requested memory cells. A state machine 152 reads the status of the address and data parity checking and provides that status to controller 102. A power management module 154 performs power management operations for non-volatile memory device 104. Non-volatile memory device 104 further includes a data cache 156 that caches data written by data parity generator/checker 144.

Figure 3:
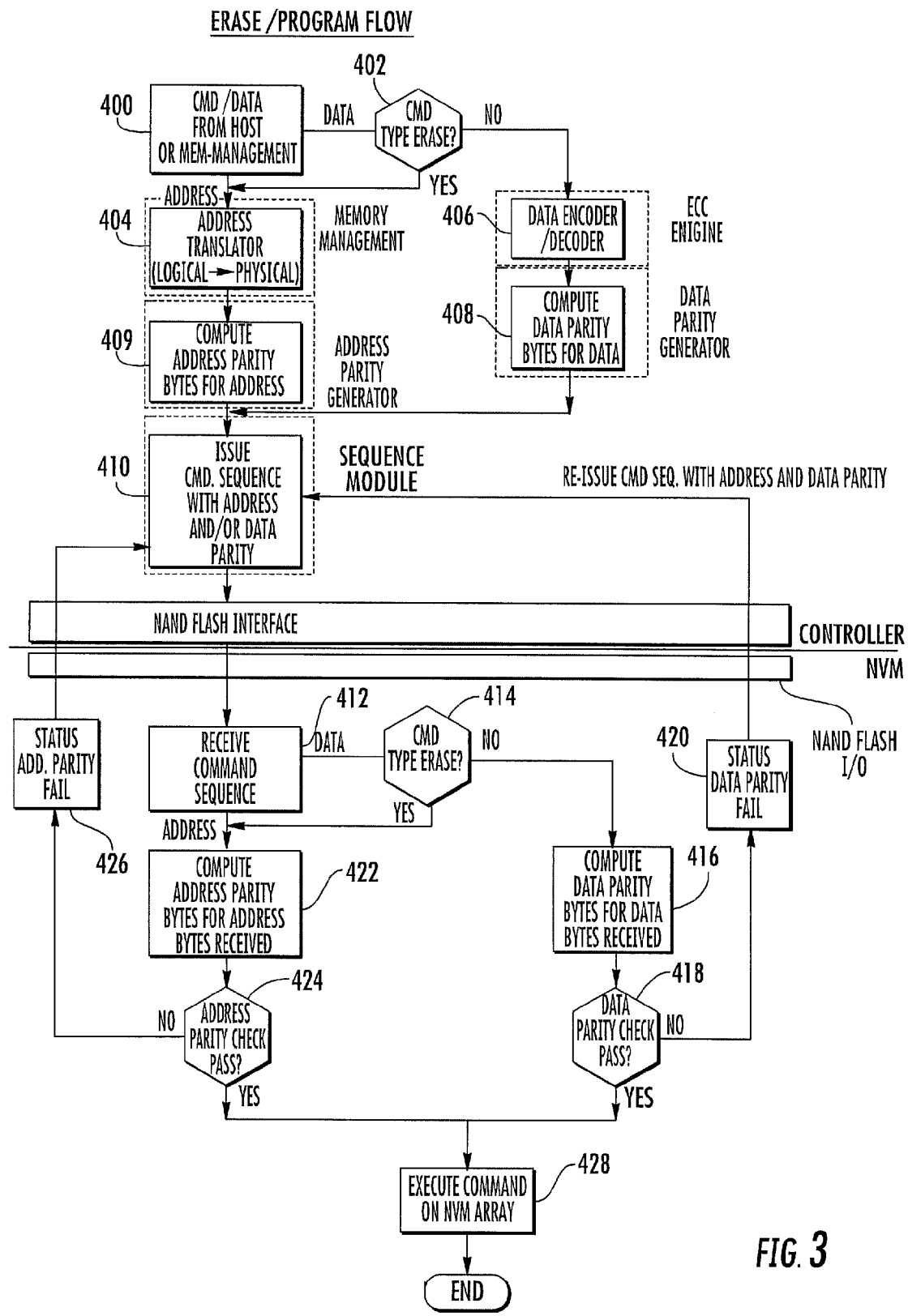
FIG. 3 is a flow chart illustrating an exemplary erase or program flow with address and data integrity checking according to an embodiment of the subject matter described herein.

FIG. 3 is a flow chart illustrating an exemplary erase/program process flow with address and data integrity checking according to an embodiment of the subject matter described herein. Referring to FIG. 3, in step 400, a command or a command and data sequence is received from the host system. For example, in the case of an erase operation, the host or memory management system may send an erase command only along with the logical addresses of the memory blocks to be erased. In the case of a program operation, the host or memory management system may send address bytes as well as data bytes to be written to the non-volatile memory cells. Step 402 represents the determination of a command type. This step may be performed by controller 102. If the command type is an erase command, then control proceeds to step 404 where the logical addresses used by the host are translated into physical addresses used by non-volatile memory device 104. In step 402, if the command type is not an erase command, control proceeds to step 406 where the ECC engine of controller 102 encodes the data if the command type is a program command or decodes the data if the command type is a read command. In step 408, controller 102 computes data parity bytes for the data bytes before the data bytes are transmitted to non-volatile memory device 104.

Returning to step 404, after address translation, in step 409, controller 102 computes address parity bytes for the address bytes. In step 410, sequencer 126 of controller 102 issues a command sequence to memory interface 130, which transmits the command sequence to state machine 152 of non-volatile memory device 104. FIG. 4A illustrates an example of a program command sequence that may be issued by controller 102 to non-volatile memory device 104. In FIG. 4A, the program command sequence includes address bytes, address parity bytes, data bytes, data parity bytes, a program execute command and a program address load command. The program command sequence causes non-volatile memory device to program or write data to non-volatile memory cells, provided that the address and data parity checks are successful. FIG. 4B illustrates an example of an erase command sequence that may be issued by controller 102. The erase command sequence does not include any data because nothing is being written to the non-volatile memory cells. The erase command sequence includes address bytes that specify the addresses to be erased, address parity bytes, an erase execute command, and an erase address load command.

Returning to FIG. 3, in step 412, state machine 152 receives the command sequence. In step 414, it is determined whether the command in the command sequence is an erase command. If the command is not an erase command, then the command is (for purposes of the flow chart in FIG. 3) a program command, and control proceeds to step 416 where data parity generator/checker 144 computes data parity bytes for the received data bytes and compares the computed data parity bytes to the transmitted data parity bytes. In step 418, it is determined whether the data parity check passes. If the data parity check does not pass, as indicated by step 420, state machine 152 communicates, through memory interface 130 (NAND flash interface in FIG. 3) of controller 102, an indication of the failure to sequencer 126, which reissues the command sequence (step 410). Reissuing the command sequence may include having the controller recalculate the address and data parity bytes for the command sequence. Control then returns to step 412 where the reissued command sequence received by non-volatile memory device 104. The reissued command sequence will then be processed with address and data parity checking by non-volatile memory device 104, as described above for the original command sequence.

Returning to step 414, if the received command is an erase command, control proceeds to step 422 where address parity bytes are computed for the received address bytes. Similarly, for a program sequence, with data bytes and address bytes, step 422 would include computing the address parity bytes for the received address bytes. In step 424, it is determined whether the address parity check passes. If the address parity check does not pass, control proceeds to step 426 where state machine 152 communicates an indication of the address parity failure to sequencer 126. The address parity failure may be communicated to sequencer 126 of controller 102 through the memory interface 130 (NAND flash interface in FIG. 3). Control then proceeds to step 410, the entire command sequence or at least the address bytes are re-issued. For example, if the address parity check fails and the data parity passes, the data may be cached by non-volatile memory device 104, the address bytes and address parity bytes may be re-issued by controller 102 in a copy back command sequence, as illustrated in FIG. 4C. In FIG. 4C, the copy back command sequence includes the re-issued address bytes, a new address parity byte, a program execute command and a copy-back program address load command. In response to receiving the copy-back program command sequence, non-volatile memory device 104 may reattempt the program operation using the cached data bytes if the address parity check passes. If both address parity and data parity checks fail, the entire command sequence is reissued. The address and data parity checking may then be reperformed by non-volatile memory device 104 for the reissued command sequence.

If the address parity check and the data parity check both pass, control proceeds to step 428 where the command is executed on the non-volatile memory array. If the command is an erase command, then the blocks of the non-volatile memory indicated by the erase command will be erased. If the command is a program command, then the data in the program command sequence will be written to the blocks of the non-volatile memory specified by the address bytes. Because the subject matter described herein performs both address and data parity checking on the non-volatile memory side of the memory interface, transmission errors are less likely to cause incorrect operations to be performed on the non-volatile memory.

As an enhancement to the subject matter described herein, if a predetermined threshold number of address or data parity errors occur, controller 102 may reduce the speed at which command sequences are sent to non-volatile memory device 102. Reducing the speed of the memory interface may reduce the likelihood of address and data parity errors.

According to another aspect of the subject matter described herein, the address and/or the data parity check performed by non-volatile memory device 104 can be configurable, i.e., enabled/disabled through firmware implementation. There may be cases when, due to controller hardware limitations, the address and/or data parity generation may not be feasible. In such cases, the system may disable the address and/or data parity check by non-volatile memory device 104.

The subject matter described herein can be implemented in any suitable NAND flash memory, including 2D or 3D NAND flash memory. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that the subject matter described herein is not limited to the two dimensional and three dimensional exemplary structures described but cover all relevant memory structures within the spirit and scope of the subject matter as described herein and as understood by one of skill in the art.

It will be understood that various details of the subject matter described herein may be changed without departing from the scope of the subject matter described herein. Furthermore, the foregoing description is for the purpose of illustration only, and not for the purpose of limitation.

What is claimed is:

1. A method for integrity checking in flash memory operations, the method comprising:
   at a controller that interfaces with a host system and that transmits command sequences for read, program, and erase operations in response to receiving corresponding commands from the host system, generating an address parity unit for an address unit and generating a command sequence including the address unit, the address parity unit, and an operation command specifying an operation to be performed on a flash memory array;
   communicating the command sequence including the address unit, the address parity unit, and the operation command from the controller to a flash memory device that includes the flash memory array;
   performing, by the flash memory device, an address integrity check using the address unit and the address parity unit received from the controller; and
   determining whether or not to perform the operation specified by the operation command based at least in part on a result from the address integrity check.

2. The method of claim 1 wherein the operation comprises a program operation and wherein the method further comprises:
   at the controller, adding a data parity unit to the command sequence to be provided to the flash memory device;
   providing a data byte and the data parity unit to the flash memory device as part of the command sequence;
   performing, by the flash memory device, a data integrity check using the data parity unit; and
   wherein determining whether to perform the operation includes determining to perform the operation based on results from the address integrity check and the data integrity check.

3. The method of claim 2 comprising performing the program operation if the address integrity check and the data integrity check both pass.

4. The method of claim 2 comprising, if the data integrity check passes and the address integrity check fails, caching the data unit at the flash memory device and communicating an indication of the failure to the controller, and sending a new address unit and a new address parity unit from the controller to the flash memory device without resending the data.

5. The method of claim 4 wherein sending the new address unit and the new address parity unit includes sending a copy-back program command sequence that includes the new address unit and the new address parity unit and wherein the flash memory device, in response to receiving the copy-back program command sequence and a successful parity check of the new address unit, executes a program command using the cached data unit.

6. The method of claim 2 comprising, if the data parity check fails, communicating an indication of the failure to the controller and re-attempting the program operation by generating a new program command sequence with a new data unit, a new address unit, a new data parity unit, and a new address parity unit and communicating the new command sequence to the flash memory device.

7. A method for integrity checking in flash memory operations, the method comprising:
at a controller, generating an address parity unit for an address unit and generating a command sequence including the address unit, the address parity unit, and an operation command specifying an operation to be performed on a flash memory array;
communicating the command sequence to a flash memory device that includes the flash memory array;
performing, by the flash memory device, an address integrity check using the address unit and the address parity unit;
determining whether or not to perform the operation specified by the operation command based at least in part on a result from the address integrity check; and
wherein the command sequence comprises an erase command sequence.

8. The method of claim 7 comprising, if the address integrity check passes, performing the erase command sequence.

9. The method of claim 7 comprising, if the address integrity check fails, communicating an indication of the failure from the flash memory device to the controller and generating, at the controller, a new erase command sequence including a new address unit, a new address parity unit and a new address unit and communicating the new erase command sequence to the flash memory device.

10. The method of claim 1 wherein computing the address parity unit includes computing the address parity unit using an exclusive OR (XOR) operation.

11. The method of claim 1 wherein computing the address parity unit includes computing the address parity unit using a cyclic redundancy check (CRC) operation.

12. The method of claim 1 comprising, if the address integrity check fails, changing a speed at which command sequences are provided from the controller to the flash memory device.

13. The method of claim 1 wherein the flash memory device comprises a NAND flash memory device.

14. The method of claim 13 wherein the NAND flash memory device comprises a 3D NAND flash memory device.

15. The method of claim 1 wherein the controller and the flash memory device are components of a non-volatile memory system in which the controller interfaces directly with a host.

16. The method of claim 1 wherein the controller and the flash memory device are components of a storage module in which the controller interfaces with a storage controller, which interfaces directly with a host.

17. The method of claim 1 wherein the controller and the flash memory device are components of a non-volatile memory system that is a component of a hierarchical storage system including a plurality of non-volatile memory systems and storage controllers, which are configured to interface with a plurality of different hosts.

18. A system for integrity checking in flash memory operations, the system comprising:
a controller that interfaces with a host system and that transmits command sequences for read, program, and erase operations in response to receiving corresponding commands from the host system, the controller including an address parity generator for generating an address parity unit for an address unit and a command sequencer for generating a command sequence including the address unit, the address parity unit, and an operation command specifying an operation to be performed on a flash memory array; and
a flash memory device for receiving the command sequence including the address unit, the address parity unit, and the operation command from the controller, the flash memory device including an address parity generator/checker for performing an address integrity check using the address unit and the address parity unit received from the controller and a state machine for determining whether or not to allow the operation specified by the operation command to be performed based at least in part on a result from the address integrity check.

19. The system of claim 18 wherein the command sequence comprises a program command sequence including a data unit and wherein the controller further includes a data parity generator for computing and adding a data parity unit to the command sequence;
wherein the command sequencer provides the data unit and the data parity unit to the flash memory device as part of the command sequence;
wherein the flash memory device further includes a data parity generator/checker for performing a data integrity check using the data parity unit; and
wherein the state machine determines whether to allow the operation specified by the operation command to be performed based on results from the address integrity check and the data integrity check.

20. The system of claim 19 wherein the state machine allows the program operation to be performed if the address integrity check and the data integrity check both pass.

21. The system of claim 19 wherein, if the data integrity check passes and the address integrity check fails, the state machine communicates an indication of the failure to the controller and wherein the controller obtains a new address unit and computes and sends a new address parity unit from the controller to the flash memory device without resending the data unit.

22. The system of claim 21 wherein sending the new address unit and the new address parity unit includes sending a copy-back program command sequence that includes the new address unit and the new address parity unit and wherein the flash memory device, in response to receiving the copy-back program command sequence and a successful parity check of the new address unit, executes a program command using the data unit.

23. The system of claim 19 comprising, if the data parity check fails, the state machine communicates an indication of the failure to the controller and wherein the controller generates and sends a new program sequence including a new data unit, a new data parity unit, a new address unit, and a new address parity unit from the controller to the flash memory device.

24. A system for integrity checking in flash memory operations, the system comprising:
a controller including an address parity generator for generating an address parity unit for an address unit and a command sequencer for generating a command sequence including the address unit, the address parity unit, and an operation command specifying an operation to be performed on a flash memory array; and
a flash memory device for receiving the command sequence from the controller, the flash memory device including an address parity generator/checker for performing an address integrity check using the address unit and the address parity unit and a state machine for determining whether or not to allow the operation specified by the operation command to be performed based at least in part on a result from the address integrity check, wherein the command sequence comprises an erase command sequence.

25. The system of claim 24 wherein, if the address parity integrity check passes, the state machine is configured to allow execution of the erase command sequence.

26. The system of claim 24 comprising, if the address integrity check fails, the state machine is configured to communicate an indication of the failure from the flash memory device to the controller, and the controller is configured to generate a new erase command sequence.

27. The system of claim 18 wherein the address parity generator is configured to compute the address parity unit using an exclusive OR (XOR) operation.

28. The system of claim 18 wherein the address parity generator is configured to compute the address parity unit using a cyclic redundancy checks (CRC) operation.

29. The system of claim 18 wherein, if the address integrity check fails, the controller is configured to change a speed at which command sequences are provided from the controller to the flash memory device.

30. The system of claim 18 wherein the flash memory device comprises a NAND flash memory device.

31. The system of claim 30 wherein the NAND flash memory device comprises a three-dimensional NAND flash memory device.

32. The system of claim 18 wherein the controller and the flash memory device are components of a non-volatile memory system in which the controller interfaces directly with a host.

33. The system of claim 18 wherein the controller and the flash memory device are components of a storage module in which the controller interfaces with a storage controller, which interfaces directly with a host.

34. The system of claim 18 wherein the controller and the flash memory device are components of a non-volatile memory system that is a component of a hierarchical storage system including a plurality of non-volatile memory systems and storage controllers, which interface with a plurality of different hosts.

35. A non-transitory computer readable medium having stored thereon executable instructions that when executed by a processor of a computer control the computer to perform steps comprising:
receiving, by a flash memory device and from a controller that interfaces with a host system and that transmits command sequences for read, program, and erase operations in response to receiving corresponding commands from the host system, a command sequence including an operation command specifying an I/O operation to be performed on a flash memory array of the flash memory device, an address unit, an address parity unit, a data unit;
performing, by the flash memory device, an address integrity check using the address unit and the address parity unit received from the controller; and
determining, by the flash memory device, whether or not to perform the operation specified by the operation command based at least in part on the address integrity check.

* * * * *